United States Patent [19]

Snyder

[11] 3,964,956
[45] June 22, 1976

[54] SYSTEM FOR MAINTAINING UNIFORM COPPER ETCHING EFFICIENCY

[75] Inventor: H. Ben Snyder, Upland, Calif.
[73] Assignee: General Dynamics Corporation, Pomona, Calif.
[22] Filed: Oct. 6, 1975
[21] Appl. No.: 619,753

Related U.S. Application Data
[62] Division of Ser. No. 517,665, Oct. 24, 1974, Pat. No. 3,951,711.

[52] U.S. Cl. ............................. 156/345; 134/57 R; 156/19
[51] Int. Cl.² ...................................... C23F 1/02
[58] Field of Search .................... 156/18, 19, 345; 134/57 R, 58 R, 103

[56] References Cited
UNITED STATES PATENTS

| | | |
|---|---|---|
| 3,427,198 | 2/1969 | Hill .................................. 134/57 R |
| 3,682,190 | 8/1972 | Patil .................................. 134/57 R |
| 3,837,945 | 9/1974 | Chiang ................................ 156/19 |
| 3,880,685 | 4/1975 | Rehm et al. ........................ 156/345 |

Primary Examiner—Douglas J. Drummond
Assistant Examiner—Jerome W. Massie
Attorney, Agent, or Firm—Neil F. Martin; Edward B. Johnson

[57] ABSTRACT

System and apparatus for the controlled etching of copper work pieces with ferric chloride etchants. The working solution is constantly monitored with regard to its oxidation reduction potential (ORP) by comparison with a standard solution or voltage. To reduce the build up of etched copper in the working solution, an ORP controller activates the removal of specific quantities of that solution which are then replaced in precise stoichiometric proportions with fresh etchant. Simultaneously, oxidant is injected into the fluid to reoxidize ferrous ions to ferric ions. The solution is constantly monitored and the ORP control means repeats the above procedure as often as necessary to maintain the ORP of the fluid within an acceptable range.

10 Claims, 3 Drawing Figures

SYSTEM FOR MAINTAINING UNIFORM COPPER ETCHING EFFICIENCY

This is a division, of application Ser. No. 517,665 filed 24 Oct. 1974 now U.S. Pat. No. 3,951,711.

BACKGROUND OF THE INVENTION

The instant invention relates to a system and apparatus for the controlled etching of copper with ferric chloride etchants.

The etching of copper work pieces has attained a farily sophisticated development. Copper work pieces, for use in electronic circuitry, are successfully etched in the existing art; however, the existing techniques are not considered particularly efficient:

Characteristically, the work piece has been introduced into an etching container and a solution of heated ferric chloride is sprayed onto the surfaces to be etched. Although these solutions are quite effective etchants, the etching procedure itself results in a reduction of the ferric ($Fe^{+++}$) ions to ferrous ($Fe^{++}$) ions, the latter being totally ineffective as an etchant. As the etching procedures continue, the concentration of the ferrous ions increases, which condition leads to a decrease in the etching effeciency or speed. Thus, the continuous accretion of copper into the etching solution reduces the ability of the etchant to efficiently perform its function. Therefore an efficient etching process must include provision for removal of the copper from the etchant solution.

The prior art includes systems designed to regenerate the solution. By regeneration, it is meant that one component, such as copper, is removed and the fluid is recycled. The solution is treated, such as exposure to chlorine to bring the solution back to its original potency. In U.S. Pat. No. 3,755,202 to Meek, an elaborate recycling system is described, which essentially functions to remove copper and to regenerate the ferric ions by the introduction of chlorine gas into the solution. This approach, along with others in use, calls for the use of auxiliary equipment that provides the controlled etch rate to be sized on the maximum work load in a given unit of time. If the work load tends to be quite variable, these techniques become quite inefficient; they become costly, use excessive amounts of space and are difficult to handle. Maintenance of the equipment of these systems similarly presents a problem.

The instant invention is designed to satisfy the shortcomings of the existing technology. The fluid is rejuvenated by extracting some of the spent etchant and replacing it with fresh etching fluid. In other words, the excess copper is removed along with some solution; fresh etchant is introduced along with an oxidizer, such as chlorine, to reoxidize the ferrous ions to ferric ions.

SUMMARY OF THE INVENTION

It is a primary object of the instant invention to provide an etching system which is efficient and requires a minimum of maintenance.

Another object of the instant invention is the provision of an etching system which is particularly useful where the etched work load is subject to substantial variance.

Yet another object of the instant invention is the automation in controlling the potency of the etchant by continuous rejuvenation thereof.

Still another object of the instant invention is the maintenance of the potency of the etching system by the reoxidizing of the ferrous ions to ferric ions.

A further object of the instant invention is the maintenance of the copper content in the etchant within narrow limits so that the system may be utilized without interruption and independent of work load.

In accordance with the above designs, the system contemplated by the instant invention utilizes the oxidation-reduction-electrical potential (ORP) of the working solution which automatically compared to a standard solution. The reference solution is composed of the appropriate nominal concentration $Fe^{+++}$, $Fe^{++}$, $Cu^+$ and $Cu^{++}$ ions. an ORP controller monitors the differences between the reference and working solutions. The ORP controller energizes a relay control which regulates the introduction of fresh etchant, removal of spent etchant, and introduction of oxidant such as chlorine. In this manner the abrupt changes in the work load are compensated for, automatically, by the system and the potency of the etchant is undiminished.

The above and other aspects and advantages of the present invention will be apparent as the description continues, and when read in conjunction with the appended drawings.

DESCRIPTION OF THE PREFERRED EMBODIMENT

The etching system hereinafter described may be utilized with a mechanical conveyor system (not shown) which transports work pieces into an etching tank or bath. Examples of the work pieces are printed circuit boards deposited on an insulating substrate. A layer of copper is deposited on one or both sides of the substrate and well known processes, such as photoresistance, effectively shield or coat those portions of the copper surface that are not to be etched. The unshielded portions of the copper surface are etched by being sprayed with etchant which may be passed, in a continuous spray, through nozzles in the etchant supply line. The above etching apparatus has not been illustrated other than by general designation of a schematic system block 10, since the instant invention is not dependent on the equipment configuration for that component. Rather the instant invention is directed to the nature of the fluid utilized in the etching apparatus and to the manner in which the fluid is supplied thereto.

The etchant utilized in this system may be a solution of ferric chloride in water. When the ferric chloride solution is sprayed onto the copper surface the ferric ($Fe^{+++}$) ions react with the copper and are reduced to form ferrous ($Fe^{++}$) ions and cuprous ($Cu^+$) ions according to the equation: $Fe^{+++} + Cu^\circ \; Fe^{++} + Cu^+$ As a cuprous ion dissolves into solution it immediately reacts with another ferric ion as shown by the following equation:

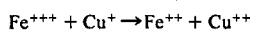

As the reaction continues, the concentration of the ferrous ions increases at the expense of the ferric ions. The effect of this reaction is to decrease the oxidation potential of the etching solution. Where the prior art has tried to solve the problem by the recycling or regeneration of the etchant, the system embodying the instant invention, rejuvenates the solution by the selective dumping of the spent solution, and selective addition of fresh etchant solution and reoxidation of the $Fe^{++}$ ions to $Fe^{+++}$ ions in the working solution.

The etchant is suitably maintained at a predetermined temperature which is dependent somewhat on the materials utilized in the component parts of the etching machine. As the example described in infra will illustrate, the general temperature range is between 120° to 140°F although temperatures of up to 200°F are sometimes associated with more sophisticated materials.

Figure 1:
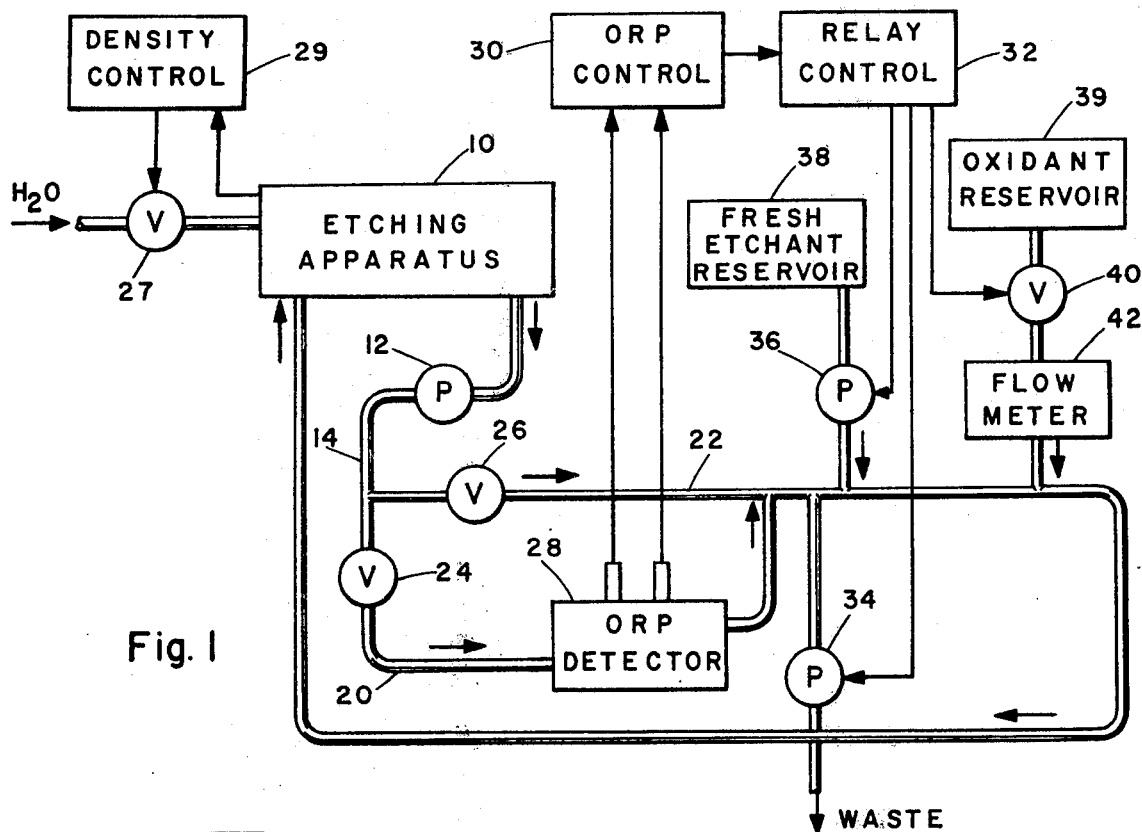
FIG. 1 is a schematic diagram of apparatus utilized in the etchant system of the instant invention.

Reference will now be made to the schematic representation in FIG. 1 for a description as to the manner in which the etchant solution is rejuvenated. Whenever the oxidation potential drops to a predetermined level etchant is pumped via pump 12 from the etching apparatus 10 into line 14 of the system. The fluid is then split into lines 20 and 22 the relative amounts in each line determined by the valves 24 and 26. The fluid in line 20 passes through the ORP detector 28. An ORP control 30 of which more will be described infra monitors the condition of the spent fluid with respect to a standard fluid. The appropriate signals are passed to a relay control 32 which determines how much fluid is to be dumped, how much fresh etchant is to be added, and how much oxidant is to be introduced. The fluid in line 20 flows into line 22 and the relay control 32 signals the pump 34 to dump a quantity of fluid to waste at a fixed rate. At the same time, downstream of the dumping station, the relay control means signals pump 36 to permit the appropriate quantity of fresh etchant to enter line 22 from the etchant reservoir 38. Concurrently, the relay control activates a solenoid valve 40 and flow meter 42 to introduce oxidant into the solution at a fixed rate from a reservoir 39. The oxidant may be chlorine ($Cl_2$), hypochlorous acid (HOCl), ozone/hydrochloric acid ($O_3$ + HCl), hydrogen peroxide/hydrochloric acid ($H_2O_2$ + HCl), ammonium chlorate (as a water solution)/hydrochloric acid ($NH_4ClO_3$ + HCl), ammonium perchlorate (as a water solution)/hydrochloric acid $NH_4ClO_4$ + HCl), perchloric acid (as a water solution)/hydrochloric acid ($HClO_4$ + HCl), chlorine monoxide ($Cl_2O$), chlorine dioxide/hydrochloric acid ($ClO_2$ + HCl), among others. This fresh etchant and oxidizer is then pumped into the return line to the etching apparatus and mixed therein with the flowing etchant stream.

The density of the etchant is measured by a density controller 29 which adds water as needed to maintain a constant density. An example of the type of device that would be adequate for this purpose is a float which can trigger a relay operating valve 27.

The oxidizer converts ferrous ions to ferric ions, the excess copper is removed by replacing spent etchant with fresh solution and consequently, the etching procedure continues with undiminished vigor. The chlorine flow rate, is set as high or slightly higher than the maximum stoichiometric rate of copper addition to the etching bath. Thus, the chlorine flows in fast enough to replace ferric ions at least as rapidly as they are formed at the maximum expected etching rate. At lower etching rates, the chlorine feed is intermittent, at such intervals and for such flow periods as are required to maintain the predetermined and desired oxidation potential. Chlorine gas reacts with the ferrous ions to reform the ferric ions according to the equation:

$$2Fe^{++} + Cl_2 \rightarrow 2Fe^{+++} + 2 Cl^-$$

As the chlorination proceeds, the ferric ion concentration increases to the detriment of the ferrous ion concentration. Not all the ferrous ions are permitted to be reoxidized since that would result in a tendency for the objectionable corrosive chlorine to escape. This is also true for other oxidants. Therefore, during the process of etching, the ORP control 30 will turn the pumps and valves off as required to maintain ferric to ferrous ion concentration within preset limits.

As the etching procedure continues the copper concentration in the etching solution will also tend to rise. The replacement of etchant means that some of the copper in the solution is dumped. The apparatus is capable of controlling, within predetermined limits, the copper concentration. When adding fresh solution, enough must be added to compensate for that carried out by the etched work piece as well as that discarded under the ORP control.

The change in electrochemical potential is utilized to monitor and adjustably control the etching vigor of the solution. One such method compares the ORP of working solution to that of a standard or reference solution. The reference solution may comprise nominal concentrations of $Fe^{+++}$, $Fe^{++}$, $Cu^+$ and $Cu^{++}$. In this method, the instantaneous ORP, at any point in time, is that produced by the difference generated between an electrically coupled platinum tipped electrode 50 (FIG. 2) and a silver/silver chloride electrode 52, the former immersed in a reference solution 54 confined in container 56 and the latter immersed in the working solution. The reaction between the copper metal and $Fe^{+++}$ proceeds as follows:

$$Cu + FeCl_3 \rightarrow CuCl + FeCl_2 \quad CuCl + FeCl_3 \rightarrow CuCl_2 + FeCl_2$$

The change in the ORP is monitored by the ORP control 30. The monitor has two electrically controlling set points zeroed at nominal solution operating conditions as to ion concentrations and temperature. One set point activates the relay control 32 connected to the pumps and valves, while the second deactivates these relays.

As the above reactions occur the ORP changes relatively uniformly with the amount of $Cu°$ reacted, therefore, by choosing any small range of copper ion concentration, $Cu^{++}$, the change in ORP will almost be linear with change in $Cu^{++}$.

The instantaneous ORP represents the overall system electrochemical condition and is purely relative to changes in the $Fe^{+++}/Fe^{++}$ ratio. This is only important from the standpoint of control since the system reactions, in addition, also include:

$$Cu + CuCl_2 \rightarrow 2CuCl$$

$$4NH_4Cl + CuCl_2 \rightarrow Cu(NH_3)_4Cl_2 + 4HCl$$

$$4NH_4Cl + CuCl \rightarrow Cu(NH_3)_4Cl + 4HCl$$

These equations represent the reactions with ammonium chloride normally added to complex $Cu^{++}$ and $Cu^+$, decreasing the mass action of these ions and increasing the etch rate.

There is also the slow reaction of $Fe^{++}$ with oxygen from the air in contact with spray droplets in a spray etch machine.

$$3FeCl_2 + O_2 + H_2O \rightarrow 3FeOCL + H_2$$

In addition there is the reaction of the compound formed in the last mentioned reaction with the HCl formed by the prior referred to reactions as well as any existing in the original etchant, as formulated.

$$FeOCL + 2HCL \rightarrow FeCL_3 + H_2O$$

The range of ORP values selected depend on the concentration of $Cu^{++}$ to $Cu^+$ in the etchant that is desired. The concentration of $Cu^{++}$ to $Cu^+$ will determine the etch rate of the solution and consequently, the operating limits of the system.

The selected range is set for the ORP control 30 so that it will activate the relay control 32 when the ORP representing the maximum concentration of $Fe^{++}$ is reached. This starts the actions of (1) removal of spent solution via pump 34; (2) introduction of fresh etchant from reservoir 38 via pump 36 and; (3) introduction of $Cl_2$ or other oxidant via valve 40.

When the ORP value representing the selected $Fe^{+++}/Fe^{++}$ ratio is reached, the relay control 32 is deactivated. It is necessary to avoid reducing the $Fe^{++}$ concentration below the level where $Cl_2$ is not only completely reacted but also very quickly, to avoid damage to the equipment by nascent chlorine.

When a portion of the operating solution is removed and an equivalent amount of fresh $FeCl_3$ etchant is introduced and the concentration of $Cu^{++}$ is reduced, the total $Fe^{+++}$ plus $Fe^{++}$ concentration is maintained. The $Fe^{+++}$ to $Fe^{++}$ ratio is also maintained by reoxidation of a staichiometric amount of $Fe^{++}$ ions to $Fe^{+++}$ ions according to the following equations:

$$Cl_2 + H_2O \rightarrow HCl + HOCl$$

$$4FeCl_2 + 4HOCl \rightarrow 4FeCl_3 + 2H_2O + O_2$$

Similar reactions can be obtained with other oxidants. For example:

$$2FeCl_2 + O_3 + 2HCl \rightarrow 2FeCl_3 + H_2O + O_2$$

$$2FeCl_2 + 2HCl + H_2O_2 \rightarrow 2FeCl_3 + 2H_2O$$

As set forth above, the amount of fresh etchant added at any time must compensate for the fluid lost by "drag-out" of the etched work pieces.

Figure 2:
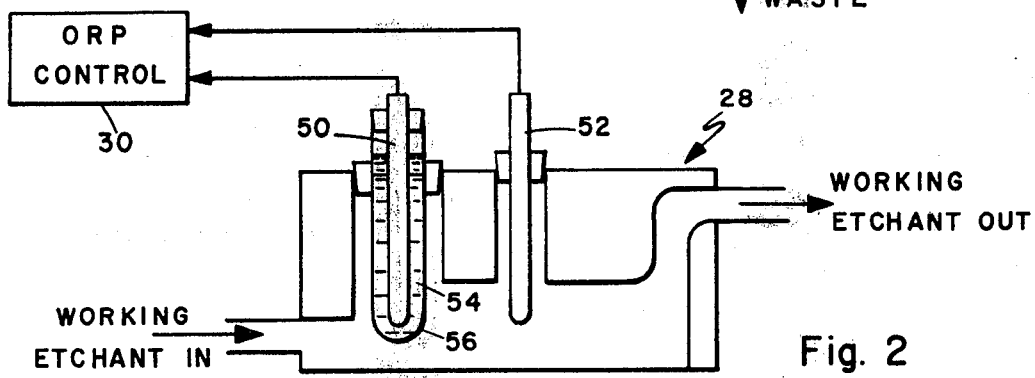
FIG. 2 is a diagrammatic view of a preferred embodiment of the ORP detector.
Figure 3:
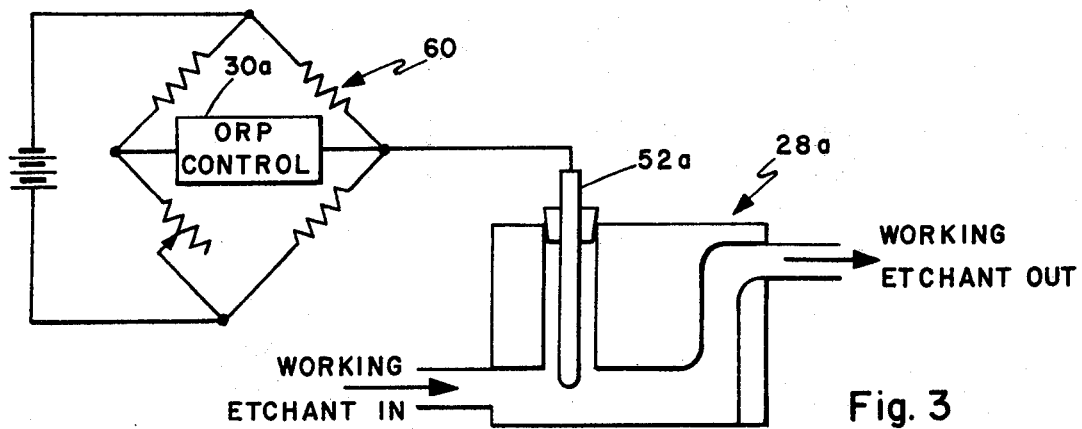
FIG. 3 is an alternate embodiment of the ORP detector, set out in a view similar to that of FIG. 2.

FIG. 2 represents a preferred embodiment of the ORP detector 28. FIG. 3 illustrates a single electrode ORP detector 28a which utilizes a single ordinary silver chloride electrode 52a, immersed in the working solution. The electrode 52a is connected to the ORP control 30a via a Wheatstone Bridge 60. In this method, the instantaneous ORP is that produced between the change in the Ag/AgCl electrode in the working solution, and a predetermined reference voltage as would be produced by a reference solution. Beyond this difference, the function of the ORP detector and the ensuing chemical reactions are identical to those described above. There are several advantages to utilizing the single electrode detector. Firstly, it is easier to compensate for vendor supplied etchant variance than with the dual electrode system. Also, the single electrode system is more readily recalibrated. Further, fouling due to depositing of solids is more readily detected. Finally, the single electrode system is more adaptable for use, on simultaneously operating techant systems. It is worth noting that the ORP detectors described above, are but two examples of appropriate detectors. Any such device would function similar to those described and the chemistry would remain the same. Therefore, the instant invention should not be construed in terms of the detectors thus far presented.

The following example illustrates both the mechanism and the ease of use of the invention.

The condition of the working solution is as follows:

$Cu^{++} = 10.9$ oz/gal $Fe^{++}/Fe^{+++} = 0.95$ pH = 0.04

Temp. = $135° \pm 2°F$

ORP = 60mv etch rate = 0.0014 inch/min

To maintain the etch rate within +0.00002 inch/min it was found that the $Cu^{++}$ concentration must be maintained within $\pm 0.1$ oz/gal. This corresponds to $\pm 2$ mv. The electrical range of $\pm 2$ mv is sufficiently broad to provide relatively easy control.

The controller 30 is set so that when the ORP equals 62 mv the following occur simultaneously: (1) the discharge pump 34, originally set to remove 0.5 gal/min from the system is started; (2) the replenishment pump 36 is activated to deliver 0.51 gal/min of fresh ferric chloride to the system and; (3) the valve 40 is opened to inject chlorine at a rate of 0.2 ft³/min.

The controller is set to shut off at 58 mv at which time the valves and pumps are closed. The ORP detection process continued to monitor the potential of the working solution and to repeat the above sequence as necessary and as determined by the work load in the system.

It will be apparent that the invention described is uniquely adapted to serve both small and large installations and those with variant work loads. It serves well in shops where the regenerative systems are of little utility. The rejuvenation system is strictly dependent on the ORP of the solution and that, in turn, is in lock-step with the amount of $Cu°$ reacted. Therefore, the invention described does not cause size, cost and area penalty that is associated with the regeneration systems when the work load is light or variable. Furthermore, the system of the invention can operate with relatively high concentrations of copper. The system develops and extends the etching art by reducing cost, increasing accuracy, and in general, adding efficiency to the process.

In addition to the previously recited advantages, the system described may be used in association with any etching system wherein the following conditions exist:

a. The solution contains a multivalent ion which acts as an etchant of a metal or non-metal with a resulting reduction in valence of said ion. Examples:

$$CuCl_2 + Cu \rightarrow 2CuCl$$

$$3FeCl_3 + Al \rightarrow 3FeCl_2 + AlCl_3$$

$$H_2Cr_2O_7 + 6H_2SO_4 + 3Cu \rightarrow Cr_2(SO_4)_3 + 3CuSO_4 + 7H_2O$$

b. The introduction of the oxidant into the etchant solution causes the reduced ion to be reoxidized to its former valence state.

$$2CuCl + Cl_2 \rightarrow CuCl_2$$

$$2FeCl_2 + H_2O_2 + 2HCl \rightarrow 2FeCl_3 + 2H_2O$$

$$Cr_2(SO_4)_3 + 3O_3 + 4H_2O \rightarrow H_2Cr_2O_7 + 3H_2SO_4 + 3O_2$$

c. The ORP values change in a continuous manner as the concentration ratio of oxided to reduced ions varies in the etchant solution.

d. Other ions in the etchant solution do not cause a precipitate to form with the reduced ion under the conditions of temperature and concentration required for normal operations.

e. The oxidant reacts readily with the reduced ions.

f. The volume of oxidant, if a liquid, that is required will not prevent maintaining the solution in stoichiometric ion balance.

g. None of the reactants, except water, are lost by evaporation.

Many changes may be made in the details of the instant invention, in the method and materials of fabrication, in the configuration and assemblage of the constituent elements, without departing from the spirit and scope of the appended claims, which changes are intended to be embraced therewithin.

What is claimed is:

1. Apparatus to etch copper work pieces which comprises;
   a. etching machine means which utilize a working solution of etchant in which there is a tendency to convert ferric ions to ferrous ions, and in which the copper ion content of the solution has a tendency to increase as the etching progresses;
   b. oxidation reduction potential detection means to continuously monitor the changes in concentration of ferric, ferrous and copper ions and to compare the same to the concentration in a reference solution;
   c. oxidation-reduction potential control means adapted to adjust the ion concentrations in the working solution responsive to the change in oxidation reduction potential monitored by said detector means;
   d. working solution dumping means responsive to said control means to dump a signaled quantity of working solution;
   e. etchant solution rejuvenating means activated by said control means to add fresh etchant solution in a quantity at least equal to that dumped by said dumping means;

whereby, said control means, according to the oxidation-reduction potential change continuously monitored by said detection means, dumps old etchant and rejuvenates with fresh etchant to reduce the copper ion content of the solution and maintain a constant etch rate.

2. The apparatus of claim 1; further including
   f. oxidizing means responsive to said control means for charging the working solution with oxidant to reconvert the ferrous ions to ferric ions and maintaining the various ion concentrations in substantially constant balance and concentration.

3. The apparatus of claim 1; in which
   said dumping means comprises a pump controllably activated by said control means.

4. The apparatus of claim 3; in which
   wherein said rejuvenating means comprises a pump and reservoir means, said pump being controllably activated by said control means corresponding to the actuation of the pump associated with said dumping means.

5. The apparatus of claim 1 further including;
   g. density control means.

6. The apparatus of claim 2; in which
   said oxidizing means comprises solenoid valve means and oxidant reservoir means;
   said valve means being selectively activated by said control means to charge the working solution with metered quantities of oxidant.

7. The apparatus of claim 1; in which
   said detection means comprises a reference solution of known oxidation reduction potential, a first electrode immersed in said reference solution, a second electrode immersed in the working solution, said electrodes being interconnected to said control means for monitoring the difference in potential detected by said electrodes.

8. The apparatus of claim 7; in which
   said first electrode is fabricated from platinum and said second electrode is fabricated from silver/silver chloride.

9. The apparatus of claim 1; in which
   said detector means comprises a single electrode immersed in said working solution and said electrode is connected to said control means which compares the potential of said working solution to a predetermined reference voltage.

10. The apparatus of claim 9; in which
    said single electrode is fabricated from silver/silver chloride.

* * * * *